United States Patent
Anderson et al.

(12)
(10) Patent No.: US 6,433,622 B1
(45) Date of Patent: Aug. 13, 2002

(54) VOLTAGE STABILIZED LOW LEVEL DRIVER

(75) Inventors: Alma Anderson, Rio Rancho; Howard Paul Andrews, Sandia Park, both of NM (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/642,181

(22) Filed: Aug. 17, 2000

(51) Int. Cl.⁷ .................................................. G05F 1/10
(52) U.S. Cl. ........................................ 327/541; 327/543
(58) Field of Search ................................. 327/538, 540, 327/541, 543, 309, 312, 313, 314

(56) References Cited

U.S. PATENT DOCUMENTS

| | | | |
|---|---|---|---|
| 4,992,677 A | | 2/1991 | Koichiro et al. ............... 326/27 |
| 5,512,855 A | * | 4/1996 | Kimura ........................ 327/538 |
| 5,557,193 A | * | 9/1996 | Kajimoto ..................... 323/266 |
| 5,619,164 A | * | 4/1997 | Tomishima .................. 327/541 |
| 6,222,787 B1 | * | 4/2001 | Yoon et al. .................. 365/226 |

* cited by examiner

Primary Examiner—Terry D. Cunningham
Assistant Examiner—Quan Tra
(74) Attorney, Agent, or Firm—Harold Tsiang

(57) ABSTRACT

The invention provides a voltage stabilized low level driver. The driver includes a switched op-amp that controls the output of the driver to match an internal reference voltage when it is switched on. When it is switched off, the op-amp turns off the output of the driver and allows the output to be pulled up by an external device. The driver also includes a slew rate control circuit for limiting the slew rate of the high-to-low transition at the output. The driver may be used for I²C applications.

7 Claims, 4 Drawing Sheets

VOLTAGE STABILIZED LOW LEVEL DRIVER

CROSS-REFERENCE TO RELATED APPLICATIONS

The present invention is related to the inventors' application Ser. No. 09/641,179 concurrently filed herewith and entitled "BIDIRECTIONAL REPEATER USING HIGH AND LOW THRESHOLD DETECTION" the disclosures of which are hereby incorporated by reference.

BACKGROUND OF THE INVENTION

The invention generally relates to voltage drivers, and more particularly to voltage stabilized low level drivers for a variety of applications.

Voltage drivers have been used for providing a voltage level to drive loads for various applications. Different applications require different types of voltage drivers. Many conventional voltage drivers are not stable. Some of them are temperature or $V_{cc}$ dependent, while others are load current or load capacitance dependent. As a result, these conventional voltage drivers have their limitations in their applications. In a particular application relating an Inter Integrated Circuits (I²C) bus interfaces, unstable voltage drivers adversely affect the circuit performance.

Therefore, there is a need for a stable voltage driver that is independent of temperature, $V_{cc}$, load current and load capacitance.

SUMMARY OF THE INVENTION

The present invention provides a voltage stabilized low level driver that outputs a low level independent of temperature, $V_{cc}$, load current, and load capacitance.

According to one embodiment of the invention, a voltage driver having an output node is provided. The driver comprises a switching circuit and an operational amplifier. The switching circuit has a control terminal and an output terminal coupled to the output node. The amplifier has a first input terminal connected to the output node, a second input terminal connected to an input reference voltage, and an output terminal connected to the control terminal of the switching circuit. The amplifier is controlled by an external disable signal for switching on and off the amplifier. The amplifier, upon being switched on, drives the control terminal of the switching circuit to cause the output node to match the reference voltage. The amplifier, upon being switched off, drives the control terminal of the switching circuit to cause the output node to have a high impedance. The high impedance allows the output node to be pulled up by an external device to a predetermined level. In a specific embodiment, the switching circuit is a transistor, and the control terminal is a gate terminal of the transistor.

According to another embodiment of the invention, a voltage driver having an output node is provided. The driver comprises a switching circuit having a control terminal and an output terminal; an operational amplifier having a first input terminal, a second input terminal, and an output terminal that is connected to the control terminal of the switching circuit, the amplifier being controlled by an external disable signal for switching on and off the amplifier; an output protection circuit coupled between the output node and the output terminal of the switching circuit; a first input protection circuit coupled between the first input terminal of the amplifier and the output node; and a second input protection circuit coupled between the second input terminal of the amplifier and an input reference voltage. The amplifier, upon being switched on, drives the control terminal of the switching circuit to cause the output node to match the reference voltage. The amplifier, upon being switched off, drives the control terminal of the switching circuit to cause the output node to have a high impedance. The high impedance allows the output node to be pulled up by an external device to a predetermined level. In another embodiment, the driver further comprises a slew rate control circuit coupled between the output node and the control terminal of the switching circuit.

According to a third embodiment of the invention, a repeater incorporating a voltage driver of the invention is provided for use in an I²C bus interface.

Other objects and attainments together with a fuller understanding of the invention will become apparent and appreciated by referring to the following description and claims taken in conjunction with the accompanying drawings.

BRIEF DESCRIPTION OF THE DRAWINGS

The invention is explained in further detail, and by way of example, with reference to the accompanying drawings wherein.

DETAILED DESCRIPTION OF THE PREFERRED EMBODIMENTS

Figure 1:
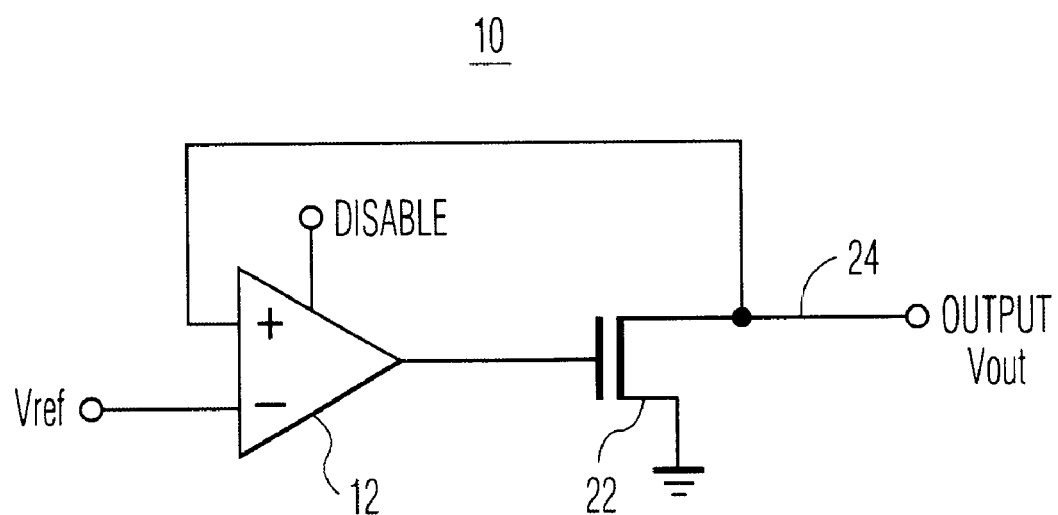
FIG. 1 shows a voltage stabilized low level driver according to a first embodiment of the invention.

The principles of the invention are described with reference to the embodiment in FIG. 1. FIG. 1 shows a voltage stabilized low level driver 10 according to a first embodiment of the invention. Driver 10 comprises an operational amplifier (op-amp) 12 and a switching circuit, e.g., an output NMOS transistor 22 having an open-drain output $V_{out}$. Op-amp 12 has its positive input terminal connected to an output node 24, forming a feedback loop and its negative input terminal connected to a reference voltage, $V_{ref}$. Op-amp 12 also has its output connected to the gate of transistor 22. When it is enabled, op-amp 12 drives transistor 22 such that the feedback mechanism causes the output voltage $V_{out}$ to match the reference voltage, $V_{ref}$. When op-amp 12 is disabled by a disable signal, the op-amp turns off transistor 22 to allow output node 24 to have a high impedance. Therefore, the output voltage $V_{out}$ can be pulled up to approximately the digital supply voltage level $V_{cc}$ by an external resistor or current source (not shown).

Figure 2:
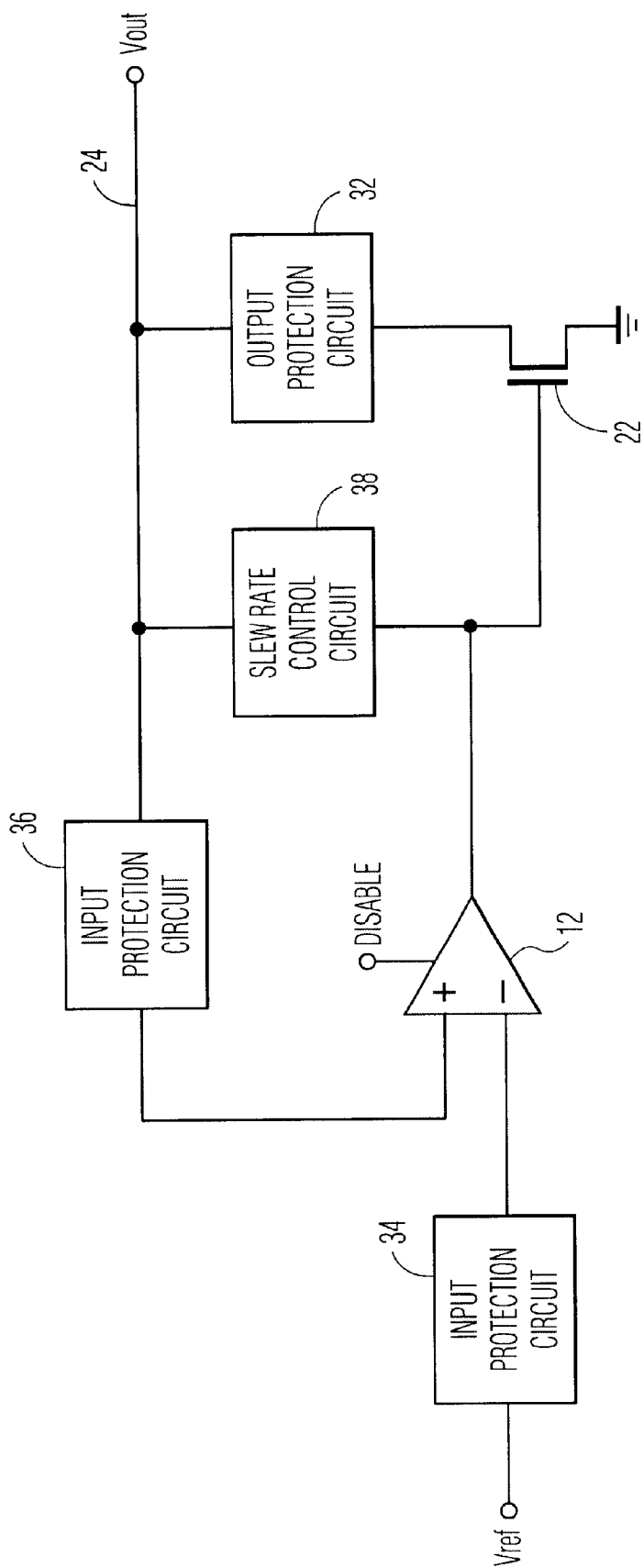
FIG. 2 shows a voltage stabilized low level driver according to a second embodiment of the invention.

FIG. 2 shows a voltage stabilized low level driver 30 according to a second embodiment of the invention. Driver 30 is a variation of driver 10 in FIG. 1. In addition to op-amp 12 and NMOS transistor 22, driver 30 includes an output protection circuit 32, input protection circuits 34 and 36, and a slew rate control circuit 38. Output protection circuit 32 is placed in series with transistor 22. Two input protection circuits 34 and 36 are placed in series with the two input terminals of op-amp 12, respectively, to maintain symmetry and noise rejection. In addition, slew rate control circuit 38 is connected between output node 24 and the gate of transistor 22.

In FIG. 2, when op-amp 12 is enabled, it acts as a feedback mechanism driving the gate of transistor 22 high to turn the transistor on. Slew rate control circuit 38 limits how quickly transistor 22 can be turned on. As the voltage $V_{out}$ at output node 24 falls to the reference voltage $V_{ref}$, op-amp 12 reduces the gate voltage of transistor 22 to the point that transistor 22 sinks just enough current from output node 24 to make the output voltage $V_{out}$ match the reference voltage $V_{ref}$.

For convenience, an industry standard type band-gap reference is used to generate the reference voltage, $V_{ref}$. In specific example, $V_{ref}$ is 0.52 V. The band-gap is also used to generate a reference current $I_{in}$ (shown in FIG. 3) to set the tail current in the op-amp. Other types of reference voltage and current may also be used with little or no effect on the circuit behavior.

The voltage stabilized low level driver according to the invention provides 100 mV stability of output low level independent of temperature, $V_{cc}$, load current and load capacitance.

Figure 3:
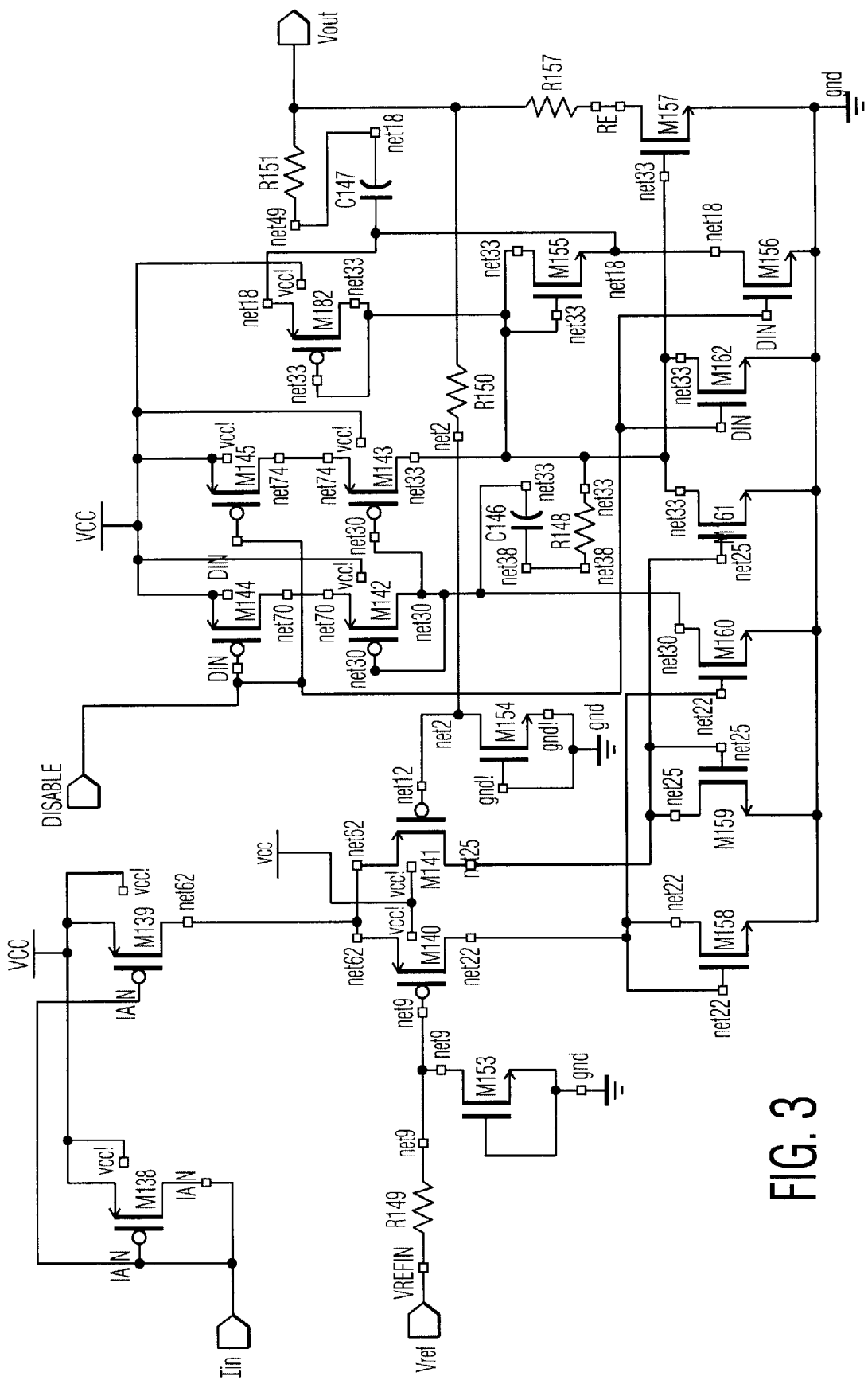
FIG. 3 shows the schematics of the circuit in FIG. 2.

FIG. 3 shows the schematics of driver 30 in FIG. 2. In FIG. 3, an input reference current $I_{in}$ is reflected using a current mirror comprised of transistors M138 and M139 to provide the tail current for the input pair of transistors M140 and M141. Resistor R150 and NMOS transistor M154 comprise the secondary input gate protection in addition to primary ESD (electrostatic discharge) protection circuit (not shown). R150 and M154 are matched with resistor R149 and transistor M153 for noise immunity considerations. The output currents from the input pair M140, M141 flow through diode wired transistors M158 and M159 and are mirrored onto transistors M160 and M161, respectively. The current through M160 is reflected through a current mirror comprised of transistors M142 and M143 to become the pull-up current which is summed against the pull-down current of M161 for the gate drive of transistor M157, which is the output NMOS transistor.

The op-amp frequency compensation is provided by capacitor I146 and resistor R148. Transistors M144, M145, M162, and M156 are used to disable the pull-up current mirror M142 and M143 and to pull the gate of the output NMOS transistor M157 down when the output NMOS transistor M157 is switched off. Diode wired transistors M182 and M155 along with capacitor I147 and resistor R151 comprise the slew rate control circuit which limits the slew rate of the output high-to-low transition as transistor M157 turns on.

Figure 4:
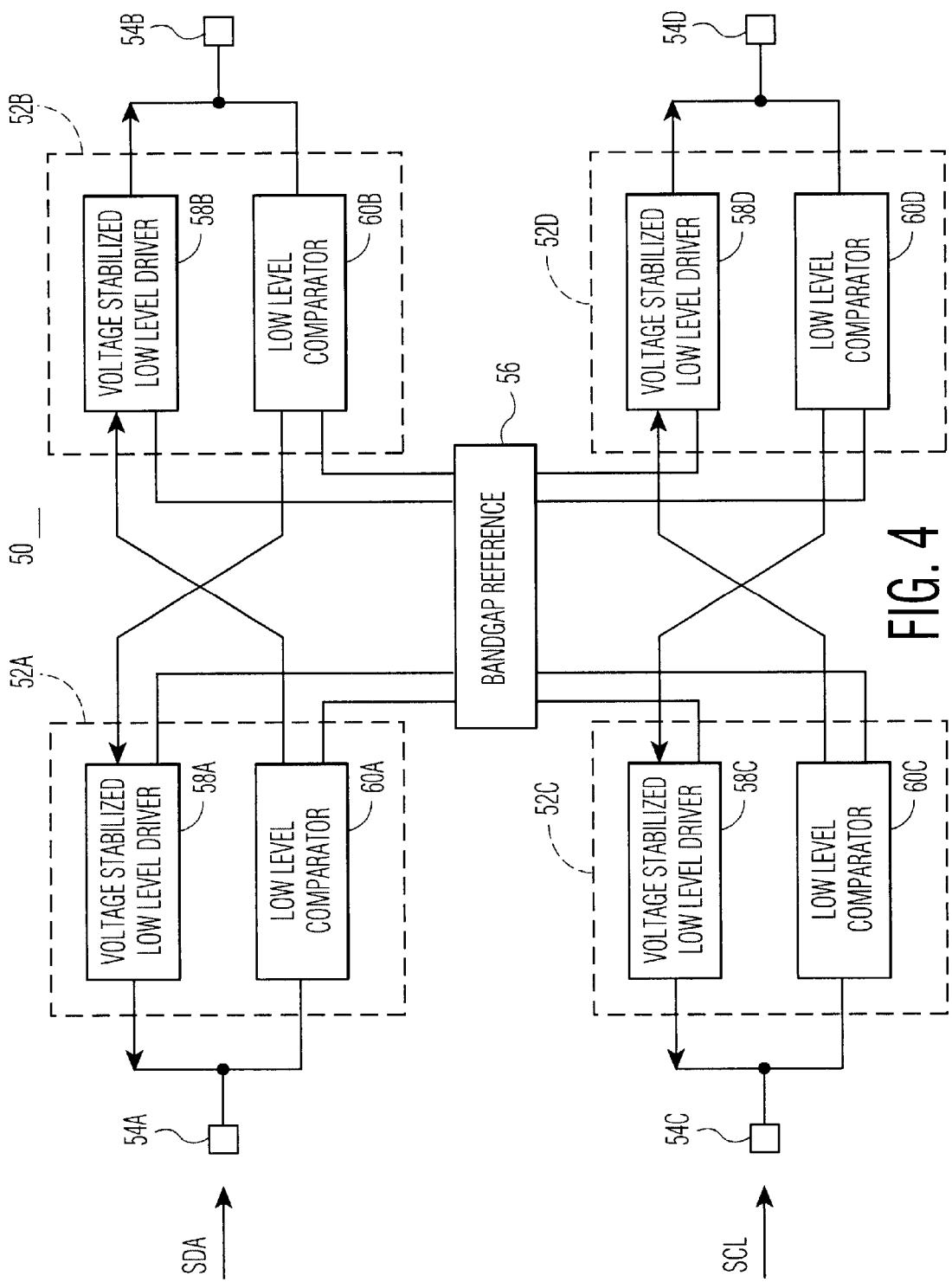
FIG. 4 shows a repeater according to a third embodiment of the invention.

FIG. 4 shows a repeater 50 according to a third embodiment of the present invention. It illustrates the use of the voltage stabilized low level driver of the present invention in an I²C bus interface application. An I²C bus is an industry standard bus interface developed by Philips Corporation which allows integrated circuits to communicated directly with each other via a simple bidirectional 2-wire bus. Interfacing devices in a I²C based system can be achieved by directly connecting them to the two bus lines: a serial data line (SDA) and a serial clock line (SCL).

In FIG. 4, repeater 50 comprises four identical I/O cells, 52A, 52B, 52C, and 52D. Cells 52A and 52B are connected to each other on the SDA line between I/O pads 54A and 54B. Similarly, cells 52C and 52D are connected on the SCL line between I/O pads 54C and 54D. Each cell includes a voltage stabilized low level driver and a low level comparator. For example, cell 52A includes a voltage stabilized low level driver 58A and a low level comparator 60A. A bandgap reference block 56 is connected to the blocks in each I/O cell. Bandgap reference block 56 generates bandgap reference derived voltages $V_{ref}$ and $V_R$, as well as a reference current (not shown) for the op-amps in drivers 58A, 58B, 58C and 58D.

When a low signal $L_1$ (e.g., a voltage less than 0.4 V) is supplied at pad 54A via SDA line, for example, low level comparator 60A compares it with a bandgap reference derived voltage, $V_R$ (e.g., 0.45 V). After determining that $L_1$ is less than $V_R$, comparator 60A outputs a low signal $L_1$ to voltage stabilized low level driver 58B. The low signal $L_1$ from comparator 60A causes driver 58B to turn on by enabling the op-amp in driver 58B, which in turn pulls pad 54B to a low level $L_2$ to match $V_{ref}$ (e.g., 0.52 V). $V_{ref}$, which is also a bandgap reference derived voltage, is higher than $L_1$ received at pad 54A and is thus treated as a high signal by comparator 60B. As a result, after determining that $L_2$ from pad 54B is greater than $V_R$, comparator 60B outputs an internal high signal $H_{int}$ (approximately equal to a digital supply voltage $V_{cc}$) to driver 58A. High signal $H_{int}$ causes driver 58A to remain off. Thus, the output of driver 58A is off. Therefore, the voltage at pad 54A remains at $L_1$. This allows latch-up free I/O pads to be achieved.

When an external high signal $H_{ext}$ (e.g., a voltage greater than 0.45 V) caused by an external pull-up resistor or current source appears at pad 54A, comparator 60A sends a high signal $H_{int}$ to driver 58B after comparing $H_{ext}$ with $V_R$. The high signal $H_{int}$ causes driver 58B to turn off. Therefore, the output of driver 58B and pad 54B are pulled up to $H_{ext}$ by an external pull-up resistor or current source (assuming the pad is not otherwise pulled down by other circuits). Comparator 60B compares $H_{ext}$ at pad 54B with $V_R$ and outputs an internal high signal $H_{int}$ to driver 58A. The internal high signal $H_{int}$ causes driver 58A to stay off. Thus, the output of driver 58A remains off. Therefore, the voltage at pad 54A remains at $H_{ext}$ caused by the external pull-up resistor or current source. This allows latch-up free I/O pads to be achieved.

The operations of cells 52C and 52D on the SCL line are similar to the operations of 52A and 52B on the SDA line described above and the description is therefore omitted.

By using the repeater of the present invention, additional capacitive loads are allowed to be added to the I²C bus interface (which has a limitation on the total allowed capacitive loads). This is achieved by splitting the capacitive loads on the SDA and SCL lines so that the total capacitive loads may be doubled.

While the invention has been described in conjunction with specific embodiments, it is evident that many alternatives, modifications and variations will be apparent to those skilled in the art in light of the foregoing description. Accordingly, it is intended to embrace all such alternatives, modifications and variations as fall within the spirit and scope of the appended claims.

What is claimed is:

1. A voltage driver having an output node, comprising:
   a switching circuit having a control terminal and an output terminal coupled to the output node;
   an operational amplifier having a first input terminal connected to the output node, a second input terminal connected to an input reference voltage, and an output terminal connected to the control terminal of the switching circuit, the amplifier being controlled by an external disable signal for switching on and off the amplifier; and
   a slew rate circuit coupled between the output node and the control terminal of the switching circuit, the slew rate circuit including at least one diode connected transistor;
   wherein the amplifier, upon being switched on, drives the control terminal of the switching circuit to cause the output node to match the reference voltage;

wherein the amplifier, upon being switched off, drives the control terminal of the switching circuit to cause the output node to have a high impedance.

2. The driver of claim 1, wherein the switching circuit is a transistor, and the control terminal is a gate terminal of the transistor.

3. The driver of claim 1, wherein the high impedance of the output node allows the output node to be pulled up by an external device to a predetermined level.

4. A voltage driver having an output node, comprising:

a switching circuit having a control terminal and an output terminal;

an operational amplifier having a first input terminal, a second input terminal, and an output terminal that is connected to the control terminal of the switching circuit, the amplifier being controlled by an external disable signal for switching on and off the amplifier;

an output protection circuit coupled between the output node and the output terminal of the switching circuit;

a first input protection circuit coupled between the first input terminal of the amplifier and the output node;

a second input protection circuit coupled between the second input terminal of the amplifier and an input reference voltage; and a slew rate control circuit coupled between the output node and the control terminal of the switching circuit, the slew rate circuit including at least one diode connected transistor;

wherein the amplifier, upon being switched on, drives the control terminal of the switching circuit to cause the output node to match the reference voltage;

wherein the amplifier, upon being switched off, drives the control terminal of the switching circuit to cause the output node to have a high impedance.

5. The driver of claim 4, wherein the switching circuit is a transistor, and the control terminal is a gate terminal of the transistor.

6. The driver of claim 4, wherein the high impedance of the output node allows the output node to be pulled up by an external device to a predetermined level.

7. The driver of claim 5, wherein the first and second input protection circuits maintain symmetry and noise rejection.

\* \* \* \* \*